United States Patent
Ansel et al.

(10) Patent No.: US 7,173,865 B1
(45) Date of Patent: Feb. 6, 2007

(54) STACKED DIE MEMORY DEPTH EXPANSION

(75) Inventors: George M. Ansel, Starkville, MS (US); Scott A. Jackson, Apex, NC (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/996,018

(22) Filed: Nov. 22, 2004

Related U.S. Application Data

(60) Provisional application No. 60/530,421, filed on Dec. 16, 2003.

(51) Int. Cl.
*G11C 7/00* (2006.01)
(52) U.S. Cl. .................... 365/191; 365/230.03
(58) Field of Classification Search .............. 365/191, 365/230.03
See application file for complete search history.

(56) References Cited

U.S. PATENT DOCUMENTS 5,265,063 A * 11/1993 Kogure ..................... 365/233
5,334,875 A * 8/1994 Sugano et al. .............. 257/686

* cited by examiner

*Primary Examiner*—Michael Tran

(57) ABSTRACT

Systems and methods for stacked die memory depth expansion. In accordance with a first embodiment of the present invention, a circuit comprises a first memory input enabling depth expansion in a memory. The circuit further comprises a second memory input enabling address range selection in a memory and a plurality of address inputs accessing an expanded memory depth. The circuit also comprises one or more external chip enable inputs and a decoding logic coupled to the first memory input, second memory input, plurality of address inputs and the external chip enable input, wherein the decoding logic generates an internal chip enable signal and a stacked die select signal.

26 Claims, 6 Drawing Sheets

| STACK | MSB_DIE | A<x+1> | CE0b | CE1 | STACK_SEL | CE_INT | Description |
|---|---|---|---|---|---|---|---|
| 0 | X | X | X | 0 | 1 | 0 | Not Stacked - A<x+1> Ignored, Chip Deselected by CE1 |
| 0 | X | X | 1 | X | 1 | 0 | Not Stacked - A<x+1> Ignored, Chip Deselected by CE0b |
| 0 | X | X | 0 | 1 | 1 | 1 | Not Stacked - A<x+1> Ignored, Chip Selected by CE0b & CE1 |
| 1 | 0 | 0 | X | 0 | 1 | 0 | Stacked, LSB Die Enabled, Chip Deselected by CE1 |
| 1 | 0 | 0 | 1 | X | 1 | 0 | Stacked, LSB Die Enabled, Chip Deselected by CE0b |
| 1 | 0 | 0 | 0 | 1 | 1 | 1 | Stacked, LSB Die Enabled, Chip Selected by A<x+1> & CE0b & CE1 |
| 1 | 0 | 1 | X | X | 0 | 0 | Stacked, LSB Die Disabled, Chip Deselected by A<x+1> |
| 1 | 1 | 0 | X | X | 0 | 0 | Stacked, MSB Die Disabled, Chip Deselected by A<x+1> |
| 1 | 1 | 1 | X | 0 | 1 | 0 | Stacked, MSB Die Enabled, Chip Deselected by CE1 |
| 1 | 1 | 1 | 1 | X | 1 | 0 | Stacked, MSB Die Enabled, Chip Deselected by CE0b |
| 1 | 1 | 1 | 0 | 1 | 1 | 1 | Stacked, MSB Die Enabled, Chip Selected by A<x+1> & CE0b & CE1 |

Figure 6

STACKED DIE MEMORY DEPTH EXPANSION

RELATED APPLICATION

This Application claims benefit of and hereby incorporates by reference in its entirety U.S. Provisional Application 60/530,421, entitled "Stacked Die Memory Depth Expansion," to Ansel and Jackson, filed Dec. 16, 2003, and assigned to the assignee of the present Application.

FIELD OF THE INVENTION

Embodiments in accordance with the present invention relate to systems and methods for stacked die memory depth expansion.

BACKGROUND

Memory devices are often packaged with more than one integrated circuit or "chip" in a single package. This multi-die ("stacked die") packaging technique produces more memory locations in a single package than is available from a device having a single integrated circuit per package. Consequently, a higher memory location density per unit area in a finished electronic system can be achieved utilizing stacked die packages and techniques. The ability to implement stacked die memory solutions increases memory density in packaged memory devices, measured in memory bits per package. This is because the underlying chip memory density increase, measured in bits per chip, is dependent upon the semiconductor process technology improvements while the stacked die approach relies on existing packaging technology. The packaged memory density is essentially one generation ahead of the achievable chip memory density.

In a first conventional solution for memory depth expansion, as shown in FIG. 1, a plurality of memory devices are coupled together. Each memory die comprises chip enable (CE) inputs, both active high and active low. These chip enable inputs are configured, in one exemplary embodiment through bonding, so that only one die is selected at a given external address. For example, the chip enable inputs are treated as though they are a high order address input, and are not directly available outside the package as chip enable lines.

Disadvantages of the first conventional solution include the lack of a chip enable input to the package and that the address counter feature of some memory integrated circuits is not usable. An address counter feature is well known in single-die memory integrated circuits, e.g., the "CY7C0852V" random access memory (RAM) device commercially available from Cypress Semiconductor Corporation of San Jose, Calif.

For example, in the first conventional solution, the address range of the underlying memory chip is a fraction of that of the packaged multi-die implementation, e.g., one half for a package comprising two chips. One of the external address bus inputs to the packaged memory system is a chip enable (CE) input to the base memory die. The address counter of the underlying memory chip is not able to select between the multiple die in the package to determine which die is accessed by a given external package input address. The chip enable (CE) inputs, CE0b (chip enable 0 "bar", active low) and CE1 (chip enable 1) are both used as external package address inputs to select between the multiple die packaged in the stacked die implementation.

In a second conventional solution for memory depth expansion, as shown in FIG. 2, a plurality of memory devices are coupled together. Each memory die comprises chip enable (CE) inputs, a bond option pin, and logic inside of the memory die to implement an exclusive-OR (XOR) combination of a control input (CESEL) with a chip enable signal. Disadvantages of the second conventional solution include that the address counter feature is not usable, as the address range of the underlying memory chip is one half of that of the packaged two-dice implementation. A further disadvantage of the second conventional solution is that one of the chip enable inputs, e.g., CE0b (chip enable 0 "bar", active low), is used as an external package address input to select between the two dice packaged in the stacked die implementation and is therefore unavailable for use as a chip select input.

In a third conventional solution for memory width expansion, as shown in FIG. 3, a plurality of memory devices are coupled together. In this third solution the chip enable signals for each memory die are coupled together in a common manner such that all devices receive the same chip enable signals. By combining the data path from all individual chips together, the overall width of data storage is increased, e.g., doubled. A disadvantage of this solution is that both dice are maintained in an active, full function state, thus drawing more power than solutions in which only one die is active at a time. In addition, an internal data path multiplexer may be required so that the base die data path width is one half of the data path width of the external data path. Such a data path multiplexer generally deleteriously slows down memory accesses.

It would be desirable to have a solution that overcomes the disadvantages of the conventional solutions. It is also desirable to accomplish the depth expansion while keeping the full feature set of the underlying memory integrated circuit.

SUMMARY OF THE INVENTION

Therefore, systems and methods for stacked die memory depth expansion would be highly desirable.

Accordingly, systems and methods for stacked die memory depth expansion are disclosed. In accordance with a first embodiment of the present invention, a circuit comprises a first memory input enabling depth expansion in a memory. The circuit further comprises a second memory input enabling address range selection in a memory and a plurality of address inputs accessing an expanded memory depth. The circuit also comprises one or more external chip enable inputs and a decoding logic coupled to the first memory input, second memory input, plurality of address inputs and the external chip enable input, wherein the decoding logic generates an internal chip enable signal and a stacked die select signal.

In accordance with another embodiment of the present invention, a memory integrated circuit comprises an array of $2^n$ addressable memory elements and decode circuitry to access the array utilizing n address input signals. Pads are disposed on the integrated circuit to accept n address input signals coupled to the decode circuitry. The integrated circuit comprises another pad disposed to accept an n+1 address input signal, and logic is coupled to the pad to generate internal chip control signals for use in a multi-die memory system.

BRIEF DESCRIPTION OF THE DRAWINGS

FIG. 6 illustrates a table showing operation of a stacked die system for memory expansion, in accordance with an embodiment of the present invention.

DETAILED DESCRIPTION OF THE INVENTION

In the following detailed description of the present invention, stacked die memory depth expansion, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Stacked Die Memory Depth Expansion

Embodiments in accordance with the present invention are described in the context of design and operation of integrated semiconductors. More particularly, embodiments of the present invention relate to memory devices implemented with stacked die memory depth expansion. It is appreciated, however, that elements of the present invention may be utilized in other areas of semiconductor operation.

Figure 1:
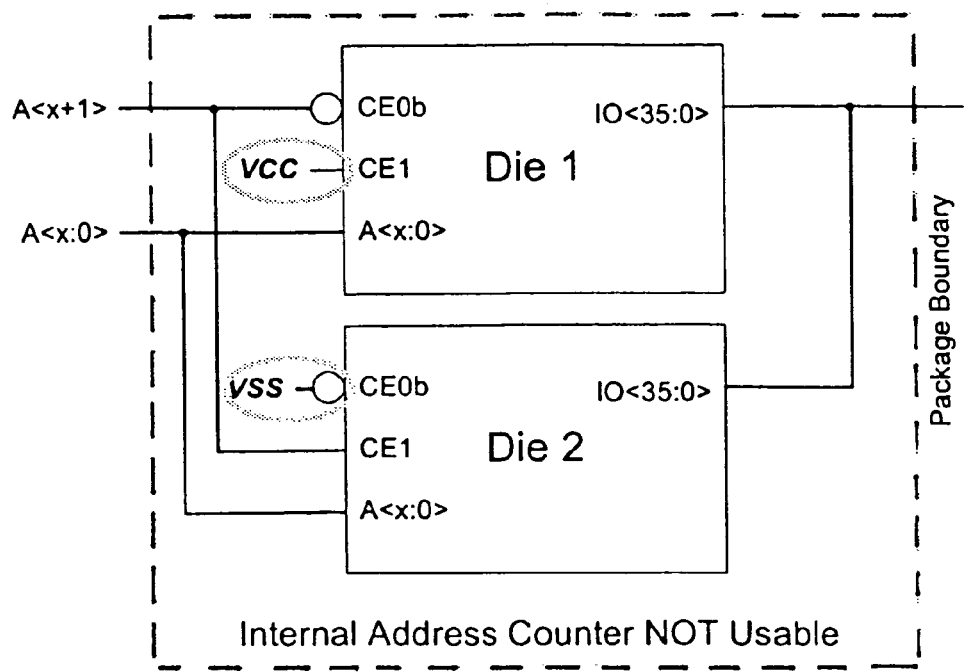
FIG. 1 illustrates a block diagram of a first conventional solution for memory expansion.
Figure 2:
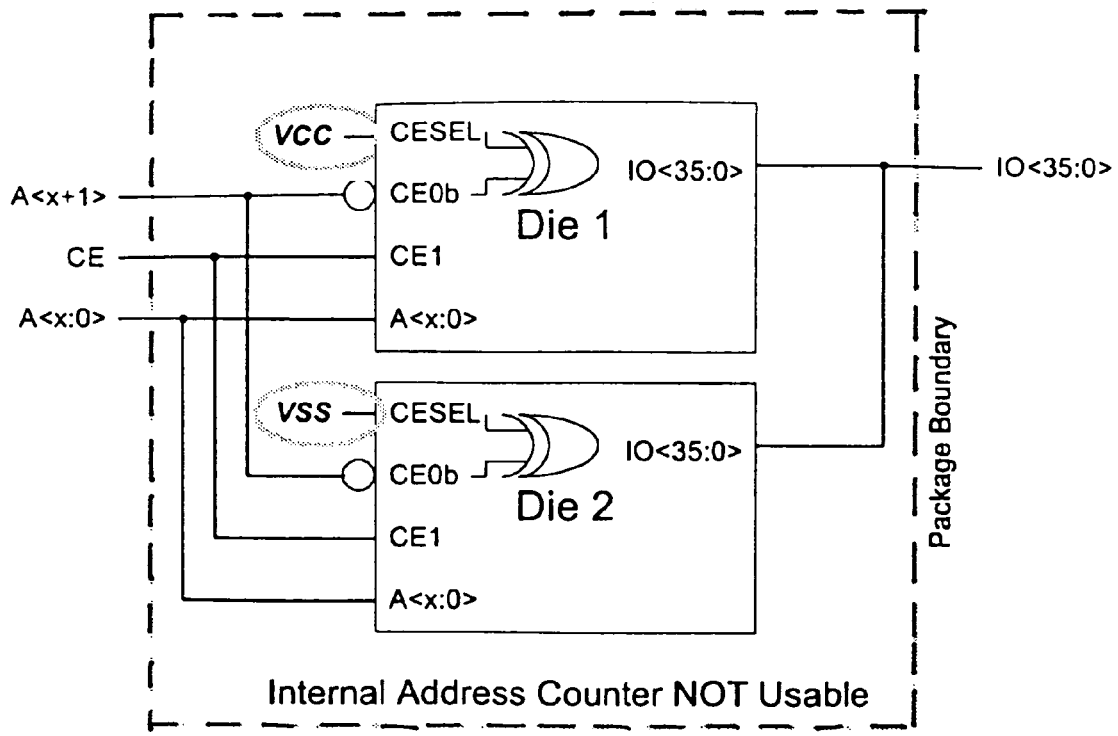
FIG. 2 illustrates a block diagram of a second conventional solution for memory expansion.
Figure 3:
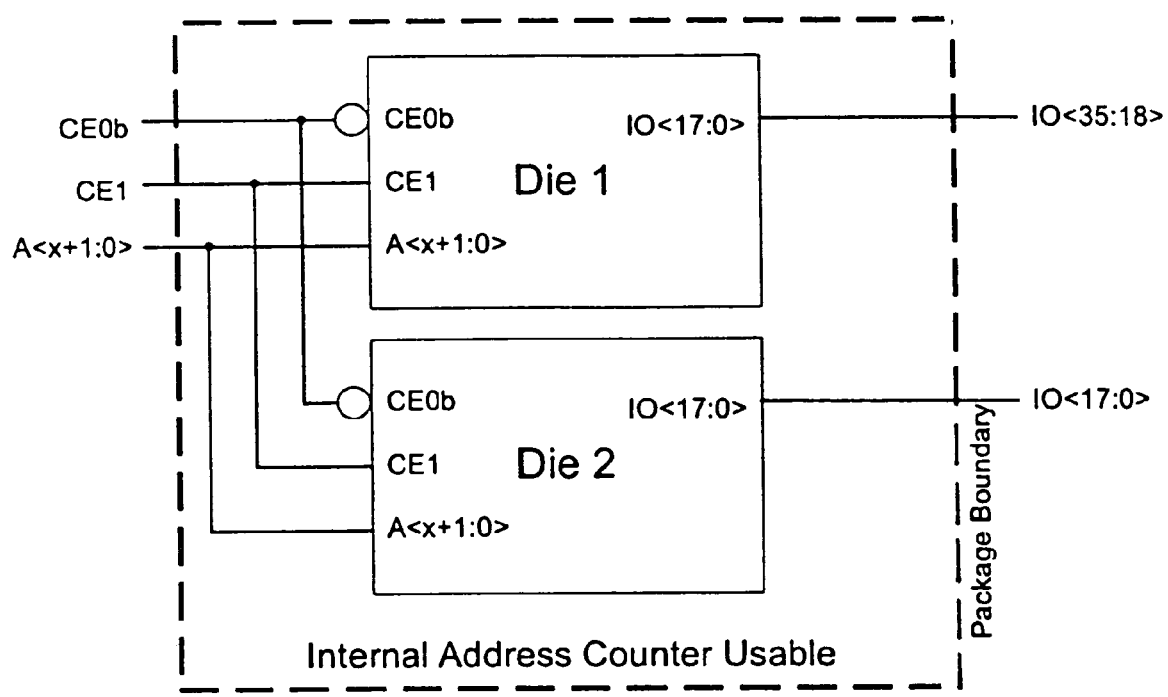
FIG. 3 illustrates a block diagram of a third conventional solution for memory expansion.
Figure 4:
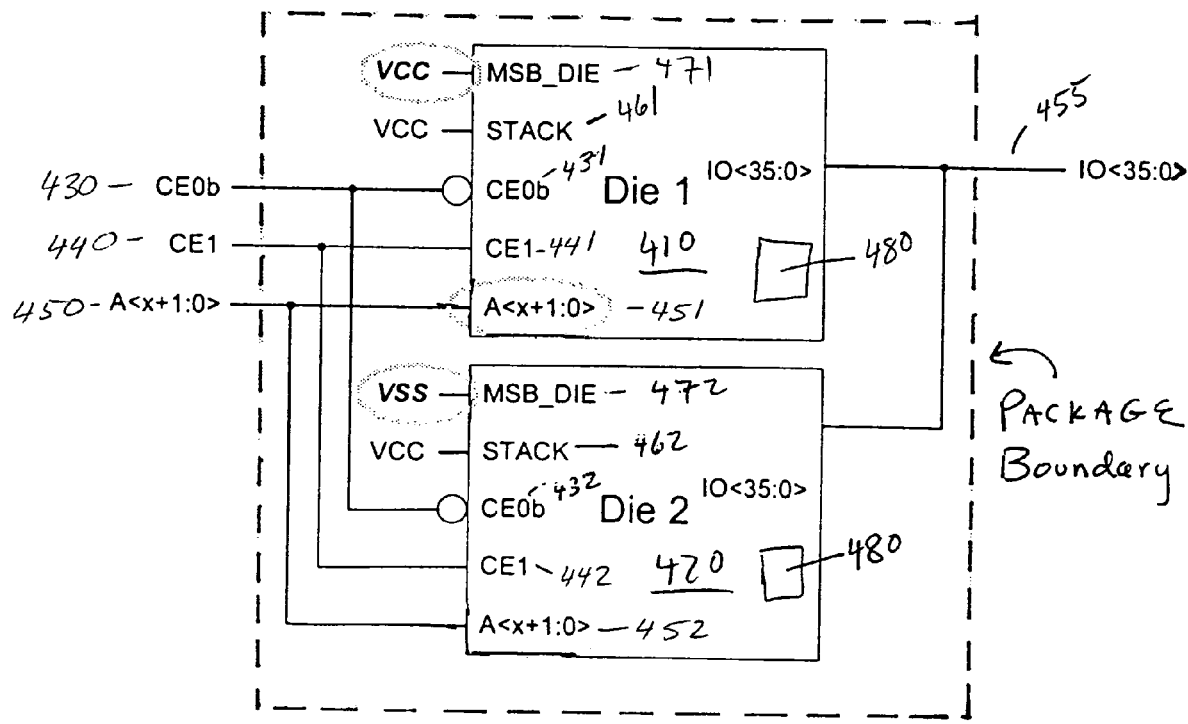
FIG. 4 illustrates a block diagram of a stacked die system for memory expansion, in accordance with an embodiment of the present invention.

FIG. 4 illustrates a block diagram of a stacked die system 400 for memory expansion, in accordance with an embodiment of the present invention. Stacked die system 400 comprises a first memory die 410 and a second memory die 420. First memory die 410 and second memory die 420 are substantially analogous, for example, they may have the same part number and/or the same memory capacity. It is to be appreciated that embodiments in accordance with the present invention are well suited to stacks of more than the illustrated two memory dice.

Stacked die system 400 comprises two chip enable (CE) inputs, CE0b 430 (chip enable 0 "bar", active low) and CE1 440 (chip enable 1). Chip enable inputs CE0b 430 and CE1 440 are accessible outside of the package. Die chip enable signals CE0b 431, corresponding to memory die 410, and CE0b 432, corresponding to memory die 420, are coupled in parallel from the system CE0b 430 input signal. Similarly, die chip enable signals CE1 441, corresponding to memory die 410, and CE1 442, corresponding to memory die 420, are coupled in parallel from the system CE1 440 input signal. Although shown as 36 bits, it is appreciated that embodiments in accordance with the present invention are well suited to any data width. Stacked die system 400 also comprises data input/output signals 455. Data input/output signals 455 are coupled in parallel to analogous signals of memory die 410 and memory die 420. It is to be appreciated that each die (410, 420) provides the full data path width.

It is to be appreciated that stacked die system 400 comprises twice an amount of memory as is available from each individual memory integrated circuit (die) 410, 420. Thus, each individual memory integrated circuit requires one less address bit (X:0) to address its memory contents than is required for stacked die system 400 to address its total memory contents (X+1:0). Conversely, stacked die system 400 requires one more address bit than each individual memory integrated circuit requires.

In accordance with an embodiment of the present invention, all stacked die system 400 address bits are coupled in parallel to each individual memory integrated circuit. For example, all stacked die system 400 address bits A<x+1:0> 450 are coupled in parallel to memory die 410 address inputs 451 and to memory die 420 address inputs 452.

In accordance with an embodiment of the present invention, integrated circuit memory devices memory die 410 and memory die 420 are provided an additional address bit, e.g., one bit beyond the number of bits required to address their individual memory capacity. Further, an internal address counter is also constructed with such an additional bit. Such additional address and address counter bits support the full extended address range of stacked memory system 400.

In accordance with an embodiment of the present invention, each die (410, 420) is provided with a bond option pad STACK (461, 462) to signal to internal chip logic that the die is part of a stacked package. For example, FIG. 4 illustrates STACK signals 461 and 462 coupled to a logic true, e.g., VCC. This state can signal to the internal address counter to utilize its additional bit in address counter operations. For example, rather than the internal address counter rolling over at a count value of $2^n-1$ as can be desired for a single die memory, in a stacked configuration the internal address counter should roll over at a count value of $2^{n+1}-1$, where n is the number of bits required in an address counter to count memory elements of a single die.

Further, each die (410, 420) is provided with another bond option pad for address range selection. A logic level on $MSB_{13}$ DIE (471, 472) signals to internal chip logic whether a particular die is to respond, e.g., accept or provide, data when the most significant bit (MSB) of the extended address range is at a logic 1 state. As illustrated in FIG. 4, MSB_DIE signal 471 of memory die 410 is coupled high to VCC, while MSB_DIE signal 472 of memory die 420 is coupled low to VSS in one embodiment. Thus, memory die 410 will be active when the most significant bit (MSB) of the extended address range is at a logic 1 state.

For example, let memory die 410 and memory die 420 comprise 65,536 ($2^{16}$) addressable memory elements, e.g., words. Consequently, all addressable memory elements of either memory die can be addressed with 16 address bits, normally signified as address bits 15-0, where address bit 15 is the most significant bit. Stacked die system 400 comprises both memory die 410 and memory die 420, consequently stacked die system 400 comprises 131,072 ($2^{17}$) addressable memory elements, requiring 17 address bits, address bits 16-0. As determined by the logic values of the MSB_DIE 471 and MSB_DIE 472 signals (in conjunction with STACK 461 and 462), the memory of memory die 410 is accessed via system or external address bits 15-0 and the memory of memory die 420 is accessed via system address bits 15-0, with system or external address bit 16 determining which die (410, 420) is accessed.

Memory integrated circuits are typically designed to have a wide range of available density options supported by a single design. Bond option pads are typically used to select the density being used in a given package. Such bond option pads can be utilized in the stacked die configuration to select the address range for each die in the staked die implementation. It is to be appreciated that density option selections can render memory elements within a die unaddressable. For example, a 4 megabit (Mb) memory integrated circuit can be supplied as a 2 Mb memory integrated circuit. A memory manufacturer might provide such chips if there are substantial faults in one half of the memory array, or if there is high demand for 2 Mb parts. In such a circumstance, only 2 Mb of memory elements are addressable, even though the actual memory integrated circuit could contain substantially greater memory elements.

Stacked memory die system 400 comprises logic circuitry 480 in each die to select or deselect the die based on the address most significant bit (MSB), the STACK bond option or the address range selection. Exemplary logic circuitry 480 is presented in greater detail in FIG. 5, below.

Stacked memory die system 400 may require multiple inputs for stacking more than two dice, as only two values can be represented by a single binary bit. In an alternate embodiment, a signal conveying more than two states may be used. Such a signal could comprise multi-state logic inputs, and such multi-state logic inputs could enable a smaller number of pins to control a given address range than could a binary input.

Figure 7:
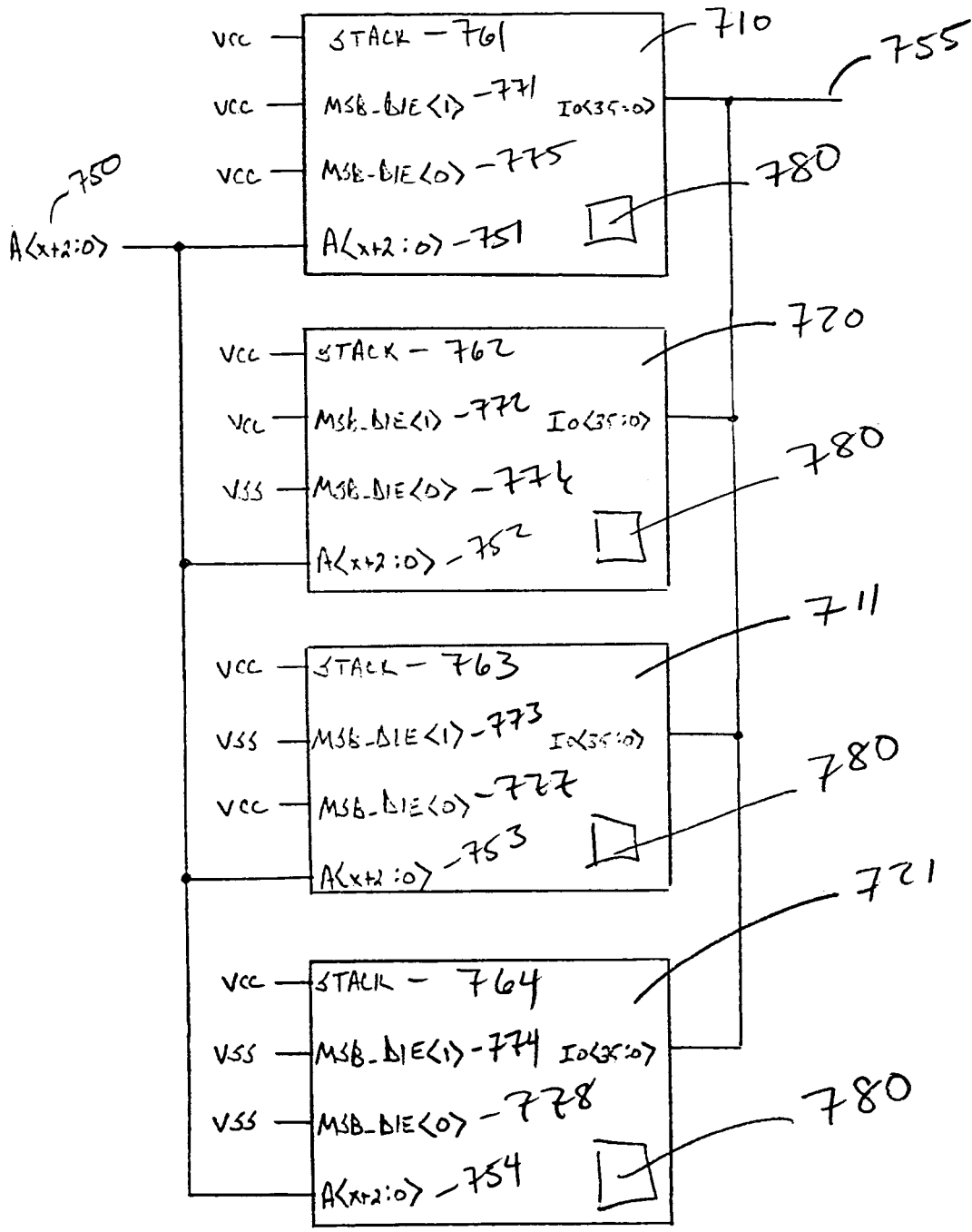
FIG. 7 illustrates a block diagram of a stacked die system for memory expansion, in accordance with an embodiment of the present invention.

FIG. 7 illustrates a block diagram of a stacked die system 700 for memory expansion, in accordance with an embodiment of the present invention. Stacked die system 700 comprises a first memory die 710, a second memory die 720, a third memory die 711 and a fourth memory die 721. Memory dice 710, 711, 720 and 721 are substantially analogous, for example, they may have the same part number and/or the same memory capacity. It is to be appreciated that embodiments in accordance with the present invention are well suited to stacks of more than the illustrated four memory dice.

Although shown as comprising 36 data bits, it is appreciated that embodiments in accordance with the present invention are well suited to any data width. Stacked die system 700 comprises data input/output signals 755. Data input/output signals 755 are coupled in parallel to analogous signals of memory dice 710, 711, 720 and 721. It is to be appreciated that each die (710, 711, 720, 721) provides the full data path width.

It is to be appreciated that stacked die system 700 comprises four times an amount of memory as is available from each individual memory integrated circuit (die) (710, 711, 720, 721). Thus, each individual memory integrated circuit requires two less address bits (X:0) to address its memory contents than is required for stacked die system 700 to address its total memory contents (X+2:0). Conversely, stacked die system 700 requires two more address bit than each individual memory integrated circuit requires.

In accordance with an embodiment of the present invention, all stacked die system 700 address bits are coupled in parallel to each individual memory integrated circuit. For example, all stacked die system 700 address bits A<x+2:0> 750 are coupled in parallel to memory die 710 address inputs 751, memory die 720 address inputs 752, memory die 711 address inputs 753 and memory die 721 address inputs 754.

In accordance with an embodiment of the present invention, integrated circuit memory dice 710, 711, 720 and 721 are provided two additional address bits, e.g., two bits beyond the number of bits required to address their individual memory capacity. Further, an internal address counter is also constructed with such additional bits. Such additional address bits and address counter bits support the full extended address range of stacked die memory system 700.

In accordance with an embodiment of the present invention, each die (710, 720, 711, 721) is provided with a bond option pad STACK (761, 762, 763, 764) to signal to internal chip logic that the die is part of a stacked package. For example, FIG. 7 illustrates STACK signals 761, 762, 763, and 764 are coupled to a logic true, e.g., VCC. This state can signal to the internal address counter to utilize its additional bits in address counter operations. For example, rather than the internal address counter rolling over at a count value of $2^n-1$ as can be desired for a single die memory, in a stacked configuration of the present embodiment the internal address counter should roll over at a count value of $2^{n+2}-1$, where n is the number of bits required in an address counter to count memory elements of a single die.

Further, each die (710, 720, 711, 721) is provided with two additional bond option pads for address range selection. Logic levels on MSB_DIE<1> (771, 772, 773, 774) and MSB_DIE<0> (775, 776, 777, 778) signal to internal chip logic 780 whether a particular die is to respond, e.g., accept or provide, data corresponding to the two most significant bits (MSB) of the extended address range. In general, each die's address range selection inputs should be coupled to a unique logic level for a stacked die memory system.

As illustrated in the embodiment of FIG. 7, MSB_DIE<1> signal 771 and MSB_DIE<0> signal 775 of memory die 710 are coupled high to VCC. MSB_DIE<1> signal 772 of memory die 720 is coupled high to VCC, while MSB_DIE<0> signal 776 of memory die 720 is coupled low to VSS. For memory die 711, MSB_DIE<1> signal 773 is coupled low to VSS while MSB_DIE<0> signal 777 is coupled high to VCC. MSB_DIE<1> signal 774 and MSB_DIE<0> signal 778 of memory die 721 are coupled low to VSS. Thus, memory die 710 will be active when the two most significant bits (MSB) of the extended address range are at a logic 1 state, e.g., 11. Memory die 721 will be active when the two most significant bits (MSB) of the extended address range are at a logic 0 state, e.g., 00. Memory die 720 will be active when the two most significant bits (MSB) of the extended address range are 10. Memory die 711 will be active when the two most significant bits (MSB) of the extended address range are 01.

Stacked memory die system 700 comprises logic circuitry 780 in each die to select or deselect the die based on the address most significant bit (MSB), the STACK bond option or the address range selection. Similar logic circuitry for a two-dice embodiment is presented in greater detail in FIG. 5, below.

Figure 5:
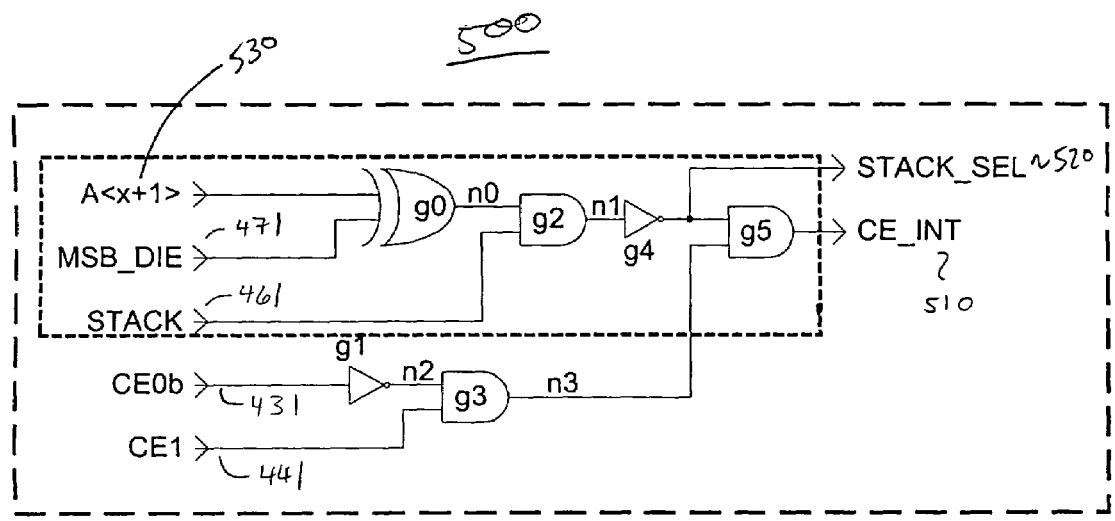
FIG. 5 illustrates internal signals of a stacked die system for memory expansion, in accordance with an embodiment of the present invention.

FIG. 5 illustrates internal chip enable logic 500 as utilized in chips of a stacked die system for memory expansion, in accordance with an embodiment of the present invention. Chip enable logic 500 can implement logic functions of logic circuitry 480 in FIG. 4. Chip enable logic 500 accesses non-data inputs to a memory integrated circuit, e.g., CE0b 431, CE1 441, STACK 461, MSB_DIE signal 471 and address inputs most significant bit A<x+1> 530, corresponding to memory die 410.

A first internal signal, internal chip enable, CE_INT 510, is utilized to control whether the die's internal circuits and output drivers are enabled. A second internal signal, STACK_SEL 520, is utilized to enable and disable input/output data pins that are connected to both dice at the package level. These input/output data are connected to the corresponding pin on all dice in the stacked die configuration, but driven by only one die at any given time, based, for example, on values of MSB_DIE 471 and A<X+1> 530. The internal signals CE_INT 510 and STACK_SEL 520 are functions of the chip input signals including chip enables CE0b 431 and CE1 441, bond out option pad STACK 461, bond out option pad MSB_DIE signal 471 and address inputs most significant bit A<x+1> 530. The purpose of these internal signals is to select or enable circuitry on the appropriate die within a STACK of dice when selected by the memory address. When the die is not in a stacked package configuration, the address input(s) is not used to generate die enable signals.

FIG. 6 illustrates a configuration table 600 showing multiple modes of operation of a stacked die system for memory expansion, in accordance with an embodiment of the present invention. In stacked die memory system 400 (FIG. 4), the memory of each die is addressed by signals A<x:0>, where A represents the address bus of the internal memory. The signal A<x+1> 530 is an input to the internal chip enable logic 500 (FIG. 5). It is to be appreciated that when stacking is disabled, e.g., STACK 461 is low, signal A<x+1> 530 becomes a "don't care" in the internal chip enable logic. When stacking is enabled, e.g., STACK 461 is high, signal A<x+1> 530 is decoded with the die address range select to determine which die is active at a particular address. The die selection based on A<x+1> 530 is accomplished through the internal chip enable logic 500 (FIG. 5). For simple binary encoding of addresses, the stacked die memory system is expandable to $2^n$ dice in a single package, where "n" is the number of extra address bits added to the base die design.

Column 610 of configuration table 600 describes the mode or state of operation of an individual memory die, e.g., memory die 410 or 420, corresponding to the input signals STACK 461, MSB_DIE signal 471, high order address signal A<x+1> 530, CE0b 431, CE1 441, STACK_SEL 520 and CE-INT 510. For example, as illustrated in row 620 of configuration table 600, if the signal STACK 461 is not true (false, 0, or low), then a die ignores the address signal A<x+1> 530 and functions as a single memory die, e.g., being deselected by a low signal level on CE1 441.

Alternatively, as shown in row 630 of configuration table 600, if the signal STACK 461 is true (1, high) and MSB_DIE signal 471 is true, the die responds as though it is part of a multi-die memory package. A not true level on high order address signal A<x+1> 530, a false level on CE0b 431 and a true level on CE1 441 select the individual memory die for memory access.

A first advantage of embodiments in accordance with the present invention is that it is more easily expandable than the conventional solutions.

This expansion is accomplished by adding address bits and adding bond option pads for address range expansion.

A second advantage of embodiments in accordance with the present invention is that the finished stacked die package solution produces a device whose feature set is not reduced in comparison to the feature set of the underlying single die device. Examples of the features enabled by embodiments in accordance with the present invention are address counter and chip enable functions.

A third advantage of embodiments in accordance with the present invention is that the finished stacked die package solution has lower power than some conventional methods. This is because only one die in the stacked die package is selected, e.g., in a high power mode, at any given external memory address. Other dice in the package are deselected, e.g., in a low power mode, at that memory address.

A fourth advantage of embodiments in accordance with the present invention is that each individual die of the finished stacked die package solution provides the full data path of the finished stacked die package solution. Thus, there is no requirement for data multiplexing that may deleteriously slow memory access to the finished stacked die package solution in comparison to memory access of the individual die.

Embodiments in accordance with the present invention, systems and methods for stacked die memory depth expansion, are thus described. While the present invention has been described in particular embodiments, it should be appreciated that the present invention should not be construed as limited by such embodiments, but rather construed according to the below claims.

What is claimed is:

1. A circuit, comprising:
   a first memory input enabling depth expansion in a memory;
   a second memory input enabling address range selection in a memory;
   a plurality of address inputs accessing an expanded memory depth;
   a plurality of external chip enable inputs; and
   decoding logic coupled to said first memory input, said second memory input, said plurality of address inputs, and said plurality of external chip enable inputs, wherein the decoding logic generates an internal chip enable signal and a stacked die select signal.

2. The circuit of claim 1 wherein said decoding logic implements in-package memory depth expansion.

3. The circuit of claim 1, wherein said internal chip enable signal is active provided all of said plurality of external chip enable inputs are in the active state and said first memory input enabling depth expansion is in the inactive state.

4. The circuit of claim 1 comprising a most significant bit input, wherein said stacked die select signal is inactive if one and only one of said most significant bit input and a most significant bit of said plurality of address inputs are in the active state.

5. The circuit of claim 1 substantiated in an integrated circuit comprising an array of memory cells.

6. The circuit of claim 5 substantiated in a stacked die memory device.

7. The circuit of claim 6, wherein said stacked die memory device comprises two substantially similar integrated circuits each comprising said circuit, and wherein said second memory input of each of said substantially similar integrated circuits are coupled to opposite logic levels.

8. A device comprising:
   a memory integrated circuit comprising:
   an array of $2^n$ addressable memory elements;
   decode circuitry to access said array utilizing n address input signals;
   pads disposed to accept n address input signals and coupled to said decode circuitry;
   a single pad disposed to accept an n+1 address input signal; and
   logic coupled to said single pad to generate internal chip control signals for use in a multi-die memory system wherein said internal chip control signals comprise an internal chip enable signal and a stacked die select signal.

9. The memory integrated circuit of claim 8 further comprising a depth enabling input coupled to said logic and for enabling depth expansion.

10. The memory integrated circuit of claim 9 further comprising an address range selection input coupled to said logic for enabling address range selection.

11. The memory integrated circuit of claim 10 wherein said logic combines said n+1 address input signal, said depth enabling input and said address range selection input to generate said stacked die select signal.

12. The memory integrated circuit of claim 11 embodied in a stacked die memory device.

13. The memory integrated circuit of claim 12 wherein said stacked die memory device comprises two substantially similar memory integrated circuits, and wherein said depth enabling input of each of said memory integrated circuits are coupled to opposite logic levels.

14. A multiple die memory device comprising:
   a) a plurality of substantially similar memory integrated circuits, comprising:
      a1) a depth enabling input for enabling depth expansion;
      a2) a plurality of address range selection inputs for enabling address range selection;
      a3) a plurality of single die address input signals sufficient to address all addressable memory elements of said multiple die memory device;
   b) a plurality of chip enable inputs to said multiple die memory device coupled in parallel to a corresponding plurality of chip enable inputs of said plurality of memory integrated circuits; and
   c) a plurality of address input signals to said multiple die memory device coupled in parallel to said plurality of single die address input signals of each of said plurality of substantially similar memory integrated circuits.

15. The multiple die memory device of claim 14 wherein said plurality of address range selection inputs for each of said plurality of memory integrated circuits are coupled within packaging of said multiple die memory device to a unique combination of logic levels.

16. The multiple die memory device of claim 15 wherein said depth enabling inputs of said plurality of memory integrated circuits are coupled to a logic true.

17. The multiple die memory device of claim 16 wherein said plurality of memory integrated circuits further comprise logic coupled to said depth enabling input, said plurality of address range selection inputs, said plurality of single die address input signals, and said plurality of chip enable inputs, said logic for determining which of said plurality of memory integrated circuits responds to a particular address presented on said plurality of address input signals.

18. The multiple die memory device of claim 14 comprising an address counter feature counting memory addresses during memory transfers.

19. The multiple die memory device of claim 14 wherein only one of said plurality of memory integrated circuits is active for any specific address.

20. A device comprising:
   a memory integrated circuit comprising:
   a multi-die memory system comprising a plurality of $2^n$ addressable memory elements;
   decode circuitry to access said array utilizing n address input signals;
   pads disposed to accept n address input signals and coupled to said decode circuitry;
   a single pad disposed to accept an n+y address input signal wherein y is a number of bits required to uniquely identify each die within said multi-die memory system; and
   logic coupled to said single pad to generate internal chip control signals for use in a multi-die memory system wherein said logic enables a particular die within said multi-die memory system in response to said y bits uniquely identifying said particular die.

21. The memory integrated circuit of claim 20 further comprising a depth enabling input coupled to said logic and for enabling depth expansion.

22. The memory integrated circuit of claim 21 further comprising an address range selection input coupled to said logic for enabling address range selection.

23. The memory integrated circuit of claim 22 wherein said internal chip control signals comprise an internal chip enable signal and a stacked die select signal.

24. The memory integrated circuit of claim 23 wherein said logic combines said n+y address input signal, said depth enabling input and said address range selection input to generate said stacked die select signal.

25. The memory integrated circuit of claim 24 embodied in a stacked die memory device.

26. The memory integrated circuit of claim 25 wherein said stacked die memory device comprises two substantially similar memory integrated circuits, and wherein said depth enabling input of each of said memory integrated circuits are coupled to opposite logic levels.

* * * * *